United States Patent
Tatsumi et al.

(10) Patent No.: US 8,411,408 B2
(45) Date of Patent: Apr. 2, 2013

(54) ELECTROSTATIC CHUCK

(75) Inventors: Yoshiaki Tatsumi, Kawasaki (JP);
Hiroshi Fujisawa, Nara (JP)

(73) Assignee: Creative Technology Corporation, Tokyo (JP)

( * ) Notice: Subject to any disclaimer, the term of this patent is extended or adjusted under 35 U.S.C. 154(b) by 210 days.

(21) Appl. No.: 13/062,427

(22) PCT Filed: Sep. 14, 2009

(86) PCT No.: PCT/JP2009/065992
§ 371 (c)(1),
(2), (4) Date: Mar. 4, 2011

(87) PCT Pub. No.: WO2010/032703
PCT Pub. Date: Mar. 25, 2010

(65) Prior Publication Data
US 2011/0157761 A1    Jun. 30, 2011

(30) Foreign Application Priority Data
Sep. 17, 2008   (JP) ................... 2008-237995

(51) Int. Cl.
*H01L 21/687*    (2006.01)
(52) U.S. Cl. ........................................ 361/234
(58) Field of Classification Search .......... 361/234
See application file for complete search history.

(56) References Cited

U.S. PATENT DOCUMENTS

| | | |
|---|---|---|
| 2007/0002516 A1 | 1/2007 | Matsumoto |
| 2007/0014073 A1 | 1/2007 | Retzlaff |
| 2008/0121278 A1 | 5/2008 | Ito et al. |

FOREIGN PATENT DOCUMENTS

| | | |
|---|---|---|
| JP | 03-16297 U | 2/1991 |
| JP | 2007-12942 A | 1/2007 |
| JP | 2007-53348 A | 3/2007 |
| JP | 2007-157886 A | 6/2007 |
| JP | 2008-131002 A | 6/2008 |

OTHER PUBLICATIONS

International Preliminary Report on Patentability issued in International Application No. PCT/JP2009/065992 on Aug. 10, 2010.
International Search Report dated Nov. 24, 2009 in International Application No. PCT/JP2009/065992.

*Primary Examiner* — Tammy Pham
*Assistant Examiner* — Kevin J Comber
(74) *Attorney, Agent, or Firm* — Birch, Stewart, Kolasch & Birch, LLP

(57) ABSTRACT

Provided is an electrostatic chuck (8) of self power supply type, which is capable of supplying power while generating power to be used by an attraction electrode (3) during processing of a substrate. The electrostatic chuck (8) attracts and holds a substrate in a substrate processing apparatus (11) that processes the substrate while generating optical energy. The electrostatic chuck (8) includes: an electrode sheet (5) including an attraction electrode (3); a metal base (1) having the electrode sheet (5) laminated on an upper surface side thereof; an internal power supply for obtaining power to be supplied to the attraction electrode (3); and a voltage boost circuit (7) for boosting voltage of the power obtained by the internal power supply. The internal power supply includes a solar cell (6), and converts the optical energy into the power during the processing of the substrate, to thereby cause the electrode sheet (5) to attract and hold the substrate.

6 Claims, 2 Drawing Sheets

ELECTROSTATIC CHUCK

TECHNICAL FIELD

The present invention relates to an electrostatic chuck including an internal power supply.

BACKGROUND ART

In a semiconductor manufacturing process, an electrostatic chuck is used for attracting and holding a semiconductor substrate in various apparatuses such as an ion implantation apparatus, an ion doping apparatus, a plasma immersion apparatus, an lithographic apparatus using, for example, an electron beam or extreme ultraviolet (EUV) lithography, and a wafer inspection apparatus for silicon wafers or the like. In addition, in the field of liquid crystal manufacturing, the electrostatic chuck is used for attracting and holding an insulating substrate in a substrate laminating apparatus, which is used for injecting liquid crystal between glass substrates, or in an ion doping apparatus.

The electrostatic chuck is generally formed by laminating, on an upper surface side of a metal base, an electrode sheet for attracting a substrate such as a semiconductor substrate or a glass substrate. Then, when a predetermined voltage is applied to an attraction electrode included in the electrode sheet, an electric charge and an electric field are formed on a surface of the electrode sheet, and with this surface serving as a substrate attracting surface, the substrates is attracted with electrical force. A dielectric material, a semiconductor, and a material containing a metal are applicable as the substrate to be attracted. However, as for attraction force to be generated, in a case in which the substrate to be attracted is a non-conductor such as glass or a polyimide resin, static electricity occurs, but almost no current flows in those materials. Thus, the attraction force relies on gradient force obtained through spatial derivative of the electric field. On the other hand, in the case of a semiconductor substrate such as a silicon wafer or a conductor such as a metal, the attraction is achieved by the Johnsen-Rahbek force, which has even higher attraction force. The attraction force varies depending on the type of a target substrate, the attraction mechanism by which the attraction force is generated, and such other factor. However, in general, the attraction force is said to range from several $g/cm^2$ to several hundred $g/cm^2$, which are relatively high values.

By the way, when the electrostatic chuck is used in such a substrate processing apparatus as a semiconductor manufacturing apparatus or a liquid crystal manufacturing apparatus, a high-voltage power supply is installed remotely outside the electrostatic chuck, and power is supplied to the attraction electrode from this external power supply via a wire, a connector, and the like, to thereby acquire a predetermined attraction force. Specifically, the electrostatic chuck side includes an input terminal for supplying power to the attraction electrode, and attracts/holds the substrate while receiving the supply of the power from the external power supply. For this reason, the physical range of use of the electrostatic chuck is affected to no small degree by the installed location of the external power supply. To address this, for example, there are proposed electrostatic chucks including a battery as the internal power supply (see Patent Literature 1 and Patent Literature 2). According to those electrostatic chucks, the main body of the electrostatic chuck includes a power supply, and hence, for example, during or after the processing of the substrate, it is possible to move/transport the substrate in a state in which the substrate is held.

CITATION LIST

Patent Literature
Patent Literature 1: JP 2007-12942 A
Patent Literature 2: JP 2007-53348 A

SUMMARY OF INVENTION

Technical Problems

However, even if a battery, a storage battery, or the like is provided as the internal power supply for the electrostatic chuck, all the steps of the substrate processing performed in the substrate processing apparatus cannot be covered with such a power supply alone. Accordingly, there occurs a case in which recharging is required or the battery needs to be replaced in the course of the processing. Further, there is a problem that the internal power supply is made larger in order to secure sufficient power. In addition, there are possibilities of, for example, contamination of peripheral equipment including the electrostatic chuck due to the reagents leakage from a rechargeable battery, and influences exerted by a leakage current.

In view of the above, the inventors of the present invention and others have conducted intensive studies on those problems, and have found that, with the electrostatic chuck including a solar cell as the internal power supply, it is possible to process the substrate while converting optical energy, which is generated from the substrate processing apparatus during the processing of the substrate, into power to be supplied to the attraction electrode, and that such an electrostatic chuck is thus immune to battery exhaustion, enables suppressing the upsizing of the internal power supply, and can be used without any possibility of contamination or the like for a long period of time. This has lead to the completion of the present invention.

Therefore, the present invention has an object to provide an electrostatic chuck of self power supply type, which is capable of supplying power while generating power to be used by an attraction electrode during processing of a substrate.

Solution to Problems

That is, the present invention provides an electrostatic chuck for attracting and holding a substrate in a substrate processing apparatus that processes the substrate while generating optical energy, the electrostatic chuck including: an electrode sheet including an attraction electrode; a metal base having the electrode sheet laminated on an upper surface side thereof; an internal power supply for obtaining power to be supplied to the attraction electrode; and a voltage boost circuit for boosting voltage of the power obtained by the internal power supply, in which the internal power supply includes a solar cell, and converts the optical energy into the power during the processing of the substrate, to thereby cause the electrode sheet to attract and hold the substrate.

The electrostatic chuck of the present invention includes the solar cell as the internal power supply, and the solar cell generates the power to be supplied to the attraction electrode. A voltage necessary for the attraction of the substrate varies depending on the type of the substrate to be attracted, the attraction mechanism, and the like. For example, assuming a case in which two attraction electrodes in a semicircular shape (semilunar shape) having a diameter of slightly less than 300 mm are used to configure a bipolar type, and a silicon wafer having a diameter of 300 mm is attracted and held, a necessary voltage is generally about ±1 kV. Meanwhile, a necessary current is determined by an insulating resistance between the attraction electrodes and a leakage current to the electrical ground. However, because the electrostatic chuck requires high voltage, and the insulating resistance of the used material is extremely high in the first place, the value of the current is about several μA at most. Accordingly, the power necessary for steadily attracting and holding the silicon wafer described above is estimated at about 2×2 (μA)×1 (kV)=4 (mW) in total for the attraction electrodes being opposite to each other. In other words, the necessary voltage is high, being on the order of kV, but the power may be relatively small.

On top of that, as for the solar cell employed in the present invention, there is no particular limitation thereon as long as the solar cell can convert, into electric energy, optical energy existing in the visible and ultraviolet light ranges in a natural environment as well as artificially-created optical energy (including optical energy generated by the substrate processing apparatus as described below). Further, the solar cell may be a so-called silicon solar cell or may be a so-called dye-sensitized solar cell. For example, the power conversion efficiency of the sunlight can be estimated to be at least 10% or larger over the whole spectrum, and even in the case of the ultraviolet light range alone, the power conversion efficiency can be estimated to be about 2%. In the case of the sunlight, the total sum of energy of the whole spectrum of the light is 0.1 W/cm$^2$ at a maximum on the ground, and hence the energy per unit area of the whole spectrum of the sunlight is 0.01 W/cm$^2$ (10 mW/cm$^2$). In the case of the ultraviolet light range, the energy per unit area is 0.002 W/cm$^2$ (2 mW/cm$^2$). Therefore, it is quite feasible to cover the power required for the attraction electrode of a general electrostatic chuck (about 4 mW) with the power acquired from the solar cell (2 to 10 mW/cm$^2$).

According to the present invention, in the substrate processing apparatus that processes the substrate while generating optical energy, the optical energy generated in the substrate processing apparatus is converted into electric energy. Here, specific examples of the substrate processing apparatus that processes the substrate while generating optical energy include, for example, an ion implantation apparatus, an ion doping apparatus, a plasma etching apparatus, a plasma immersion apparatus, a plasma doping apparatus, an ashing apparatus, a CVD apparatus, an lithographic apparatus using an electron beam or extreme ultraviolet light (EUV) lithography, a wafer inspection apparatus for a semiconductor substrate, a sputtering apparatus, a light cleaning apparatus, a lamp annealing, an oxidation treatment apparatus, and a thermal diffusion apparatus, which are used in a semiconductor manufacturing process. In addition, the specific examples include a substrate laminating apparatus used for filling liquid crystal between glass substrates, an ion doping apparatus, an etching apparatus, an ashing apparatus, a sputtering apparatus, a CVD apparatus, and a thermal diffusion apparatus, which are used in the field of liquid crystal manufacturing. Further, cleaning or surface treatment apparatuses other than those apparatuses are included in the examples of the substrate processing apparatus because printed wiring or a substrate made of, for example, metal or plastic is attracted to the electrostatic chuck, to thereby perform processing of plasma or ion irradiation or other such processing.

The optical energy generated in such substrate processing apparatuses as mentioned above as the examples refers to energy directly used in predetermined substrate processing or energy indirectly generated from other energy used in the substrate processing. For example, in the exposing apparatus, the ultraviolet light including the EUV is generated. In the ion implantation apparatus, an ion source used for the substrate processing generates the visible light and the ultraviolet light. In the plasma etching apparatus or the like, the visible light and the ultraviolet light are generated by plasma. In the lamp annealing apparatus, the visible light and the ultraviolet light are generated from a xenon lamp or a tungsten halogen lamp. Here, the "lux" is used to express the intensity of light with reference to the sensitivity of the human eye (lux: in lm/m$^2$). In general, outdoor sunlight is about 30,000 lux, and indoor fluorescent light is about 1,000 lux. For example, the fluorescent light, the ion source, and the plasma etching apparatus are regarded as the same in that the ion source used in the ion implantation apparatus and the plasma etching apparatus generate the visible light and the ultraviolet light to generate plasma. Thus, it is conceived that such substrate processing apparatuses as the ion implantation apparatus using the ion source and the plasma etching apparatus using plasma have a luminance of about 10,000 lux at the lowest estimate, that is, about ⅓ of the luminance of the sunlight.

Note that, as given above as an example, the electrostatic chuck of the present invention is preferably used in the substrate processing apparatus that generates optical energy directly used in the substrate processing or the substrate processing apparatus that generates optical energy indirectly from other energy used in the substrate processing, but, for example, the electrostatic chuck may also be used in a substrate processing apparatus that generates optical energy from a fluorescent light used as illumination. However, from the perspective of power obtained from the solar cell, it is preferred that the electrostatic chuck be used in the former substrate processing apparatuses.

The solar cell used as the internal power supply may be installed in any portion of the electrostatic chuck. However, in consideration of the fact that the optical energy is normally supplied from an upper side of the substrate in the substrate processing apparatus, it is preferred that the solar cell be installed in such a portion that the solar cell does not block the reception of the optical energy, such as an upper surface side of the metal base and a substrate attracting surface side of the electrode sheet. Further, it is only necessary that wire connection be made for the power to be supplied from the solar cell to the attraction electrode. The attraction electrode and the solar cell may be formed in an integrated manner or may be disposed at the same location. Besides, the attraction electrode and the solar cell may be connected by a wire, such as a cable, and disposed such that the attraction electrode and the solar cell are spaced apart from each other. Note that, a light receiving surface side of the solar cell may be provided with a protection layer made of, for example, quartz glass with the aim of protecting the solar cell against exposure to plasma or the like.

Further, the electrostatic chuck of the present invention includes a voltage boost circuit, and uses the voltage boost circuit to boost the voltage of the power obtained from the solar cell. The voltage obtained from the solar cell is several volts at most. In order to convert light into voltage, a silicon solar cell utilizes a band gap between different types of semiconductors, which is called the photovoltaic effect, and hence the voltage thus obtained is small. As for the dye-sensitized solar cell, its mechanism uses a chemical reaction as in a normal battery, and hence the voltage is small. Accordingly, in order to attain such a voltage that enables the electrostatic chuck to obtain a sufficient attraction force to attract the substrate, outputs from the solar cells may be connected in series. However, taking into account the footprint and the like, there is provided the voltage boost circuit, such as a voltage boost switching circuit. The voltage boost circuit and the solar cell may be formed in an integrated manner as needed or may be disposed at the same location. Besides, the voltage boost circuit and the solar cell may be connected by a wire and disposed such that the voltage boost circuit and the solar cell are spaced apart from each other. Further, charge storage means, such as a large-capacity capacitor or a rechargeable battery, may be provided so that the electrostatic chuck can store surplus power. It is desired that such charge storage means be thin and light. Here, the large-capacity capacitor normally refers to a capacitor having a capacity of 1 F or larger. In recent years, a wide variety of such large-capacity capacitors have been available and used as substitutes for batteries, and the power capacity thereof can be estimated at 10 mWh/g at the least in terms of per weight of the capacitor. For example, assuming that the mass of the capacitor is 10 g, if a calculation is carried out for a case in which the power consumption of the electrostatic chuck is 4 mW as described above, a result thereof shows that the electrostatic chuck can be used without being supplied with optical energy for about 25 hours. It is needless to say that the stored power may be used for the electrostatic chuck, such as being supplied to the attraction electrode. In addition, the stored power may be supplied to other external apparatuses than the electrostatic chuck.

Further, similarly to the publicly-known electrostatic chuck, the electrostatic chuck of the present invention is formed by laminating, on an upper surface side of the metal base, the electrode sheet including the attraction electrode. There is no particular limitation on the shape, the structure, the size, materials, etc. of the metal base or the electrode sheet. However, to give an example, for example, the metal base is made of aluminum, copper, stainless steel, or the like, and generally has, on the upper surface side thereof, a mount surface that varies depending on the type and the size of the substrate to be attracted/held, such as a semiconductor substrate or a glass substrate. As for the electrode sheet, a general electrode sheet includes insulating layers on both upper and lower surface sides of the attraction electrode. The attraction electrode may be divided into two, that is, upper and lower layers, and an interelectrode insulating layer may be interposed between those attraction electrodes. For the insulating layer, a material having a predetermined shape and a predetermined film thickness may be used, including an insulating film made of, for example, polyimide, and a ceramic plate. The insulating layer may be formed by spraying ceramic powder, such as alumina ($Al_2O_3$) powder, aluminum nitride (AlN) powder, or zirconia ($ZrO_2$) powder. Further, as for the attraction electrode, apart from metal foil, a metal film formed by a sputtering method, an ion plating method, or the like may be subjected to etching into a predetermined shape, to thereby form the attraction electrode. Alternatively, the attraction electrode may be obtained by, for example, the spraying of a conductive metal or the printing of a paste conductive metal. Further, the shape of the attraction electrode may be set as appropriate depending on the type, the size, etc. of the substrate to be attracted. For example, the attraction electrode may constitute a so-called bipolar electrostatic chuck, in which voltage is applied to two attraction electrodes, or may constitute a unipolar electrostatic chuck. Note that, in manufacturing the electrostatic chuck of the present invention, the electrode sheet may be bonded to the upper surface side of the metal base through an intermediation of a bonding layer, or the lower insulating layer, the attraction electrode, and the upper insulating layer may be laminated on the upper surface side of the metal base.

Advantageous Effects of Invention

According to the electrostatic chuck of the present invention, the optical energy generated while the substrate processing apparatus is processing the substrate is converted into power by the solar cell, and the power is supplied to the attraction electrode, to thereby hold the substrate. Thus, the electrostatic chuck of the present invention is of self generating type, which does not require the external power supply, and is also capable of moving and transporting the substrate in the state in which the substrate is attracted. Moreover, it is possible to suppress the upsizing of the internal power supply, and also, there is no possibility of contamination or the like. Further, it is possible to achieve simplification, including the peripheral equipment of the electrostatic chuck, resulting in reduced failures and the like, and also resulting in excellent reliability for long duration use.

DESCRIPTION OF EMBODIMENT

Hereinbelow, with reference to the attached drawings, a preferred embodiment of the present invention is specifically described. Note that, the present invention is not limited to the description below.

Figure 1:
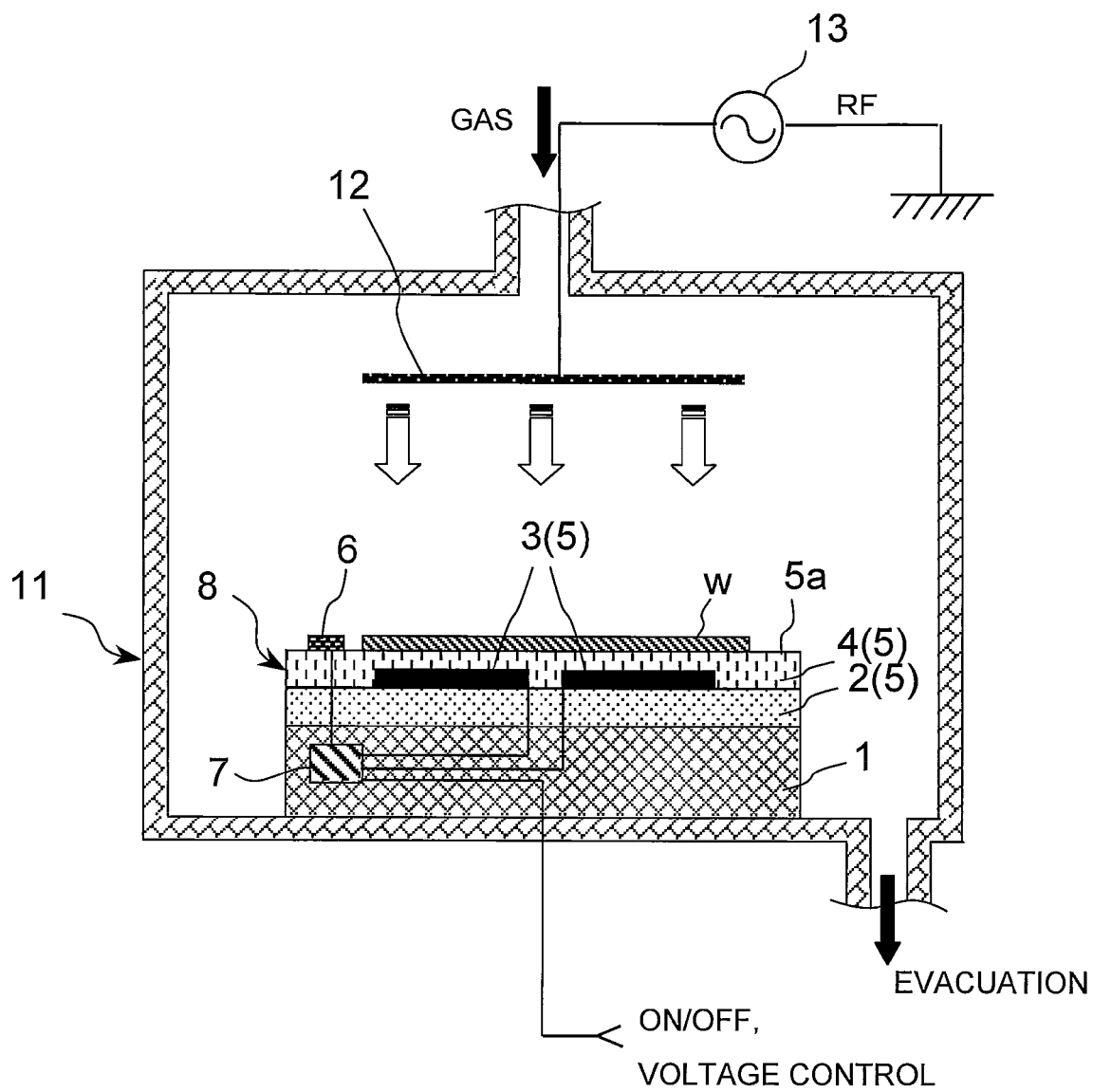
FIG. 1 is a perspective schematic cross section illustrating how, in a parallel-plate plasma etching apparatus, a substrate is attracted and held by using an electrostatic chuck of the present invention to process the substrate.

FIG. 1 is a schematic cross section illustrating how, in a parallel-plate plasma etching apparatus 11, a silicon wafer w is attracted and held by using an electrostatic chuck 8 of the present invention to perform etching processing on the silicon wafer w. In the electrostatic chuck 8 according to this embodiment, an electrode sheet 5 is bonded to an upper surface side of a metal base 1, which is made of aluminum and has a thickness of 12 mm and a diameter of 340 mm. The electrode sheet 5 is formed by laminating, on lower and upper surface sides of attraction electrodes 3, a lower insulating layer 2 and an upper insulating layer 4, respectively, which are formed of a polyimide film having a thickness of 100 μm and a diameter of 298 mm. In the electrode sheet 5, the attraction electrodes 3 are made of copper having a thickness of 12 μm, and two electrodes in a semicircular shape (semilunar shape) having a diameter of 294 mm are disposed such that diameter sides thereof are opposed to each other. Further, on the electrode sheet 5, eight solar cells 6 (AM-5815, manufactured by SANYO Electric Co., Ltd., having a total light receiving area of approximately 3 $cm^2$), which are made of amorphous silicon and have a dimension of 10.8 mm×31.8 mm×1.1 mm (thickness), are mounted in parallel in a portion that is located on a periphery of a substrate attracting surface 5a to which the substrate w is to be attracted later, and that does not attract the substrate (already subjected to anodizing). Further, the metal base 1 is integrated with a voltage boost portion 7 including a voltage boost switching circuit. Note that, the light receiving surface side of the solar cell 6 is provided with a quartz layer (not shown) having a thickness of 100 μm with the aim of protecting the solar cell 6 against direct exposure to plasma.

As described above, the electrostatic chuck 8 according to this embodiment includes the eight solar cells 6 having a total light receiving area of 3 $cm^2$. A voltage generated using natural light is 4.5 V at a maximum, and the amount of current per unit area is 0.3 mA/$cm^2$. Therefore, the eight solar cells 6 correspond to a total power (mW) of 3×4.5×0.3×8=32.4 mW.

Figure 2:
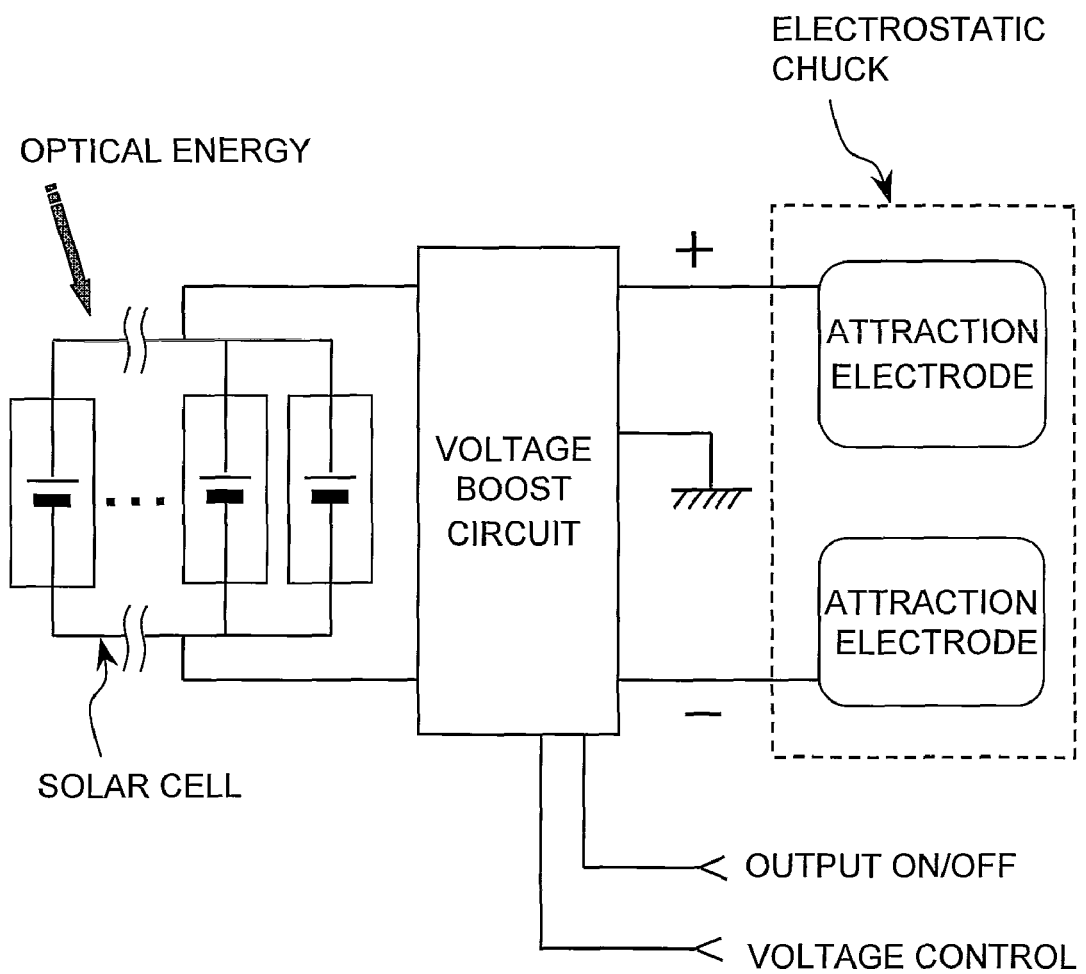
FIG. 2 is a block circuit diagram of the electrostatic chuck of the present invention for supplying power to attraction electrodes by utilizing electromotive force of solar cells.

Then, with a plasma apparatus, as described above, about ⅓ of this total power can be expected to be generated, and hence power to be generated by the solar cells 6 included in the electrostatic chuck 8 is approximately 11 mW. In view of the above, in the electrostatic chuck 8 according to this embodiment, it is assumed that two attraction electrodes 3 constituting a bipolar type are operated at voltages of ±1,000 V. As in a block circuit of the electrostatic chuck (electrostatic chuck system) according to this embodiment illustrated in FIG. 2, power obtained from the solar cells 6 is boosted by the voltage boost portion 7 integrated in the metal base 1 until a potential difference between the electrodes becomes ±1,000 V. The voltage boosted by the voltage boost circuit is supplied to the two attraction electrodes 3, but a switch for remotely turning ON/OFF the chuck operation of the electrostatic chuck is connected to the voltage boost portion 7. Further, a potentiometer (not shown) is externally connected with the aim of controlling the voltage to be supplied to the attraction electrodes 3. Note that, the potentiometer may be integrated in the metal base 1, and further, the above-mentioned ON/OFF switch may be omitted, thereby exerting attraction force in synchronization with the generation of plasma in the plasma apparatus.

Then, while causing the above-mentioned electrostatic chuck 8 to attract and hold the silicon wafer w having a diameter of 300 mm, an oxide film of the substrate was subjected to the etching processing in the plasma etching apparatus 11. First, in order to efficiently utilize generated plasma, while evacuating a processing chamber of the plasma etching apparatus 11, a reactive gas (in this case, $CF_4$) was introduced from an upper side of the processing chamber, and a high-frequency power supply 13 was used to excite RF between an upper electrode 12 and the electrostatic chuck 8, thereby generating plasma. Then, the etching processing was performed on the silicon wafer w at an etching rate of 8K Å/min for 3 minutes under conditions that the frequency of the RF was 13.56 MHz, the supplied power was 500 W, the gas flow rates of the reactive gases were 200 sccm and 50 sccm for argon and $CF_4$, respectively, the degree of vacuum in the processing chamber was 0.1 Pa, and the temperature of the substrate was 30° C. As a result, it has been confirmed that high-frequency power can be stably supplied without anomalous heating of the substrate, an abnormality in degree of vacuum, or positional displacement. Further, the processed silicon wafer w was examined for the depths of etched grooves with an electron microscope, and the depths were 23K Å on average. In addition, the deviation of groove widths was examined and fell favorably within ±2%.

As can be understood from the above, according to the electrostatic chuck 8 of this embodiment which includes the solar cells as the internal power supply, in the etching processing performed on the silicon wafer by using a plasma processing apparatus, it is possible to obtain all the necessary power that is required by the attraction electrodes for attracting the substrate to the electrostatic chuck, from the optical energy generated in the plasma etching apparatus.

INDUSTRIAL APPLICABILITY

The electrostatic chuck of the present invention may be employed in various substrate processing apparatuses that are used in a semiconductor manufacturing process, a liquid crystal manufacturing process, and the like as long as the apparatus generates optical energy in performing predetermined processing on a substrate. In particular, the electrostatic chuck of the present invention is capable of attracting and holding the substrate without using an external power supply, and hence, for example, it is possible to move/transport the substrate with the substrate being attracted. Therefore, the present invention is not limited to the conventional application of the electrostatic chuck in the substrate processing apparatus, and has possibilities for creating new application modes.

REFERENCE SIGNS LIST

1: metal base
2: lower insulating layer
3: attraction electrode
4: upper insulating layer
5: electrode sheet
5a: substrate attracting surface
6: solar cell
7: voltage boost portion (voltage boost switching circuit)
8: electrostatic chuck
11: plasma etching apparatus
12: upper electrode
13: high-frequency power supply
w: substrate

The invention claimed is:

1. An electrostatic chuck of self power supply type for attracting and holding a substrate in a substrate processing apparatus that processes the substrate while generating optical energy,
the electrostatic chuck comprising:
an electrode sheet including an attraction electrode;
a metal base having the electrode sheet laminated on an upper surface side thereof;
an internal power supply for obtaining power to be supplied to the attraction electrode; and
a voltage boost circuit for boosting voltage of the power obtained by the internal power supply,
wherein the internal power supply comprises a solar cell, and receives the optical energy to convert the optical energy into the power during the processing of the substrate, to thereby cause the electrode sheet to attract and hold the substrate.

2. An electrostatic chuck according to claim 1, wherein the optical energy is obtained by ion implantation, plasma irradiation, exposure, sputtering, cleaning, annealing, oxidation, or diffusion, which is performed when the substrate is processed.

3. An electrostatic chuck according to claim 1 or 2, further comprising charge storage means.

4. An electrostatic chuck according to claim 3, wherein the charge storage means comprises a large-capacity capacitor or a rechargeable battery.

5. An electrostatic chuck according to claim 1, wherein the solar cell includes, on a light receiving surface side, a protection layer made of quartz glass.

6. An electrostatic chuck according to claim 1, wherein the solar cell is disposed on the upper surface side of the metal base or on a substrate attracting surface side of the electrode sheet for attracting and holding the substrate.

* * * * *